(12) United States Patent
Pelloie

(10) Patent No.: US 6,787,850 B1
(45) Date of Patent: Sep. 7, 2004

(54) DYNAMIC THRESHOLD VOLTAGE MOS TRANSISTOR FITTED WITH A CURRENT LIMITER

(75) Inventor: Jean-Luc Pelloie, Moirans (FR)

(73) Assignee: Commissariat a l'Energie Atomique, Paris (FR)

( * ) Notice: Subject to any disclaimer, the term of this patent is extended or adjusted under 35 U.S.C. 154(b) by 0 days.

(21) Appl. No.: 09/890,120

(22) PCT Filed: Feb. 4, 2000

(86) PCT No.: PCT/FR00/00268

§ 371 (c)(1),
(2), (4) Date: Jul. 27, 2001

(87) PCT Pub. No.: WO00/46858

PCT Pub. Date: Aug. 10, 2000

(30) Foreign Application Priority Data

Feb. 5, 1999 (FR) .......................................... 99 01369

(51) Int. Cl.[7] .............................................. H01L 27/01
(52) U.S. Cl. ...................... 257/347; 257/345; 257/376; 257/402; 257/40.3; 257/404; 257/364; 257/904; 257/903; 327/322; 327/534; 327/537; 438/149; 438/282; 438/289; 438/217
(58) Field of Search ................................ 257/347, 345, 257/376, 402, 403, 404, 904, 905, 369; 438/149, 282, 289, 217; 327/322, 534, 537

(56) References Cited

U.S. PATENT DOCUMENTS

| | | | | |
|---|---|---|---|---|
| 4,228,447 A | * | 10/1980 | Sato et al. ...................... 357/42 |
| 4,906,587 A | * | 3/1990 | Blake ........................... 437/41 |
| 5,250,835 A | * | 10/1993 | Izawa .......................... 257/408 |
| 5,696,390 A | * | 12/1997 | Godignon et al. ........... 257/109 |
| 5,753,955 A |   | 5/1998 | Fechner |
| 5,808,346 A |   | 9/1998 | Ueda |
| 5,821,769 A | * | 10/1998 | Douseki ....................... 326/34 |
| 5,905,296 A | * | 5/1999 | Tuttle .......................... 257/536 |
| 6,015,993 A | * | 1/2000 | Voldman et al. ............. 257/355 |
| 6,100,564 A | * | 8/2000 | Bryant et al. ................ 257/347 |
| 6,121,079 A | * | 9/2000 | Kim ............................. 438/199 |
| 6,204,534 B1 | * | 3/2001 | Adan ........................... 257/347 |
| 6,232,158 B1 | * | 5/2001 | Lee .............................. 438/160 |
| 6,392,467 B1 | * | 5/2002 | Oowaki et al. .............. 327/427 |
| 6,452,232 B1 | * | 9/2002 | Adan ........................... 257/347 |

FOREIGN PATENT DOCUMENTS

| | | |
|---|---|---|
| EP | 0 616 371 | 9/1994 |
| FR | 0520556 | 7/1983 |
| WO | WO 96/07205 | 3/1996 |

OTHER PUBLICATIONS

Yannis P. Tsividis, "Operation and Modeling of the Mos Transistor".

Jean–Pierre Colinge, "An SOI Voltage–Controlled Bipolar–MOS Device" *IEEE Transactions on Electron devices, vol. ED–34, Apr. 1987*, p. 845–849.

Mishel Matloubian, "Analysis of Hybrid–Mode Operation of SOI Mosfets" *1993 IEEE.* p. 106–107.

Fariborz Assaderaghi, "A Dynamic Threshold Voltage MOSFET (DTMOS) for Ultra–Low Voltage Operation" *1994 IEEE.* p. 809–812.

* cited by examiner

*Primary Examiner*—Allan R. Wilson
*Assistant Examiner*—Edgardo Ortiz
(74) *Attorney, Agent, or Firm*—Thelen Reid & Priest LLP

(57) ABSTRACT

The invention concerns a semi-conductor device comprising on a substrate:
  a first dynamic threshold voltage MOS transistor (10), with a gate (116), and a channel (111) of a first conductivity type, and
  a current limiter means (20) connected between the gate and the channel of said first transistor.

In accordance with the invention, this first transistor is fitted with a first doped zone (160) of the first conductivity type, connected to the channel, and the current limiter means comprises a second doped zone (124) of a second conductivity type, placed against the first doped zone and electrically connected to the first zone by an ohmic connection.

Application to the manufacture of CMOS circuits.

11 Claims, 8 Drawing Sheets

DYNAMIC THRESHOLD VOLTAGE MOS TRANSISTOR FITTED WITH A CURRENT LIMITER

This application is a national phase of PCT/FR00/00268, and International Application No. 99 01369, which was filed on Feb. 5, 1999, and was not published in English.

TECHNICAL FIELD

This invention concerns a dynamic threshold voltage MOS transistor (insulated gate Transistor) fitted with an integrated current limiter. This device is intended in particular to be made on an SOI (silicon on insulator) type substrate, in other words a substrate having a thin surface layer of silicon insulated by an underlying layer of oxide.

The invention also concerns a process for making such a device in a particularly compact form with a view to integrating it into a circuit.

The invention finds applications particularly in the manufacture of CMOS circuits operating with very low supply voltages such as for example micro-processors or digital signal processors (DSP).

PRIOR ART

The prior art is shown particularly in documents (1), (2), (3) and (4) mentioned below and the references for which are given at the end of this description.

A usual MOS transistor may be considered as being made up of two intrinsic components. The first component is the MOS transistor itself, in which the current, controlled by the gate, flows between the drain and the source, and in which the substrate is subject to fixed polarisation. The second component is a bipolar parasitic transistor for which the drain and the source act as transmitter and collector, and the substrate acts as the base.

Document (1) proposes the simultaneous activation of the MOS component and the bipolar component so as to increase the total current supplied by the device, and to do this by connecting the transistor gate to its substrate. Such a device is however little used on account of the significant increase in static current related to the operation of the bipolar component. Indeed, minimal static current is generally required in CMOS circuits.

Document (2) proposes a hybrid mode of operation of the MOS and shows that, by means of the connection between the gate and the substrate, the threshold voltage of the MOS may be lowered and the transistor characteristic gradient under the threshold may be improved at low voltage, in other words before the bipolar transistor is activated. This operational principle has given rise to the dynamic threshold voltage transistor described in document (3) "Dynamic Threshold Voltage MOSFET" or "DTMOS".

The symbolic electrical diagram of a dynamic threshold voltage MOS transistor (DTMOS) is shown in the appended FIG. 1.

The transistor 10 comprises, like any MOS transistor, a drain terminal 12, connected to a source terminal 14 by a channel, and a gate terminal 16 to control the current passing through the channel.

Moreover, an electrical connection 18 is established between the gate and the substrate. In the figure a substrate contact terminal to which the electrical connection 18 is connected is identified with the reference 11.

The threshold voltage $V_t$ of a MOS transistor depends on the voltage applied on its substrate.

As shown in document (4), the voltage $V_t$ may be expressed by the following relation.

$$V_t = V_{fb} + 2\phi_f + \gamma\sqrt{2\phi_f - V_{bs}}$$

In this expression, $V_{fb}$ is the flat band voltage, $\phi_f$ is the Fermi potential, $\gamma$ is the substrate effect coefficient and $V_{bs}$ is the potential difference applied between the substrate and the transistor source.

When the gate is connected to the substrate as is the case for the DTMOS, the voltage applied to the gate is also applied to the substrate. The threshold voltage is then dependent on the voltage applied to the gate, which justifies the term "dynamic threshold voltage transistor".

During normal operation, in respect of an NMOS transistor, taken here by way of illustration, the polarisation applied to the gate is positive relative to the source. It brings about the forward bias of the junction existing between substrate and source, and possibly the forward bias of the junction between substrate and drain (depending on the polarisation applied to the drain). If high voltage is applied to the gate, the same voltage applied to the substrate causes a significant current to pass in the junction. This contributes to the increase in total static current in a circuit fitted with the DTMOS component.

The maximum acceptable current for a DTMOS in SOI technology is about 0.6 V, so as to limit this junction current to approximately 100 pA per micrometer of transistor width. Using a DTMOS at a higher supply voltage requires a device to be inserted which enables the junction current to be reduced. Such a device is inserted between the gate and the substrate and is called a current limiter. Reference may be made on this subject to document (3).

The current limiter is a second MOS transistor for which different configurations of polarisation are conceivable.

A first proposed configuration is shown in the appended FIG. 2.

FIG. 2 shows the MOS transistor 10 of FIG. 1, which is fitted with a current limiter in the form of a second MOS transistor 20 inserted between the gate terminal 16 and the substrate terminal 11.

The gate 26 of the second transistor is polarised at the supply voltage in the case of an NMOS transistor and is polarised at the earth in the case of a PMOS transistor.

Another possible polarisation configuration of the second transistor is shown in the appended FIG. 3.

It is distinguished from the configuration in FIG. 2 essentially in that the gate 26 of the second transistor 20 is henceforth connected to its source.

It should be specified that the second transistor 20 is a conventional transistor providing no access to the substrate. Its substrate is floating.

One essential difficulty related to the manufacture of a device according to the diagrams in FIG. 2 or 3 lies in the fact that making the limiter transistor and the connections with the first transistor is incompatible with the requirements for reducing the sizes of components.

Indeed, the search for an ever greater integration density of components does not allow the electrical diagram of the devices mentioned above to be transcribed directly in an integrated version.

DISCLOSURE OF THE INVENTION

The purpose of the present invention is to propose a DTMOS transistor device with current limiter, which. does not have the difficulties above and is able to be made in the form of an integrated circuit.

A particular purpose is to propose a device of this type which allows the number and range of connections required between the transistors to be reduced, so as to allow it to be made compactly.

Another purpose is propose a particularly cost-effective process for manufacturing the device.

To fulfil these purposes, a more precise object of the invention is a semi-conductor device, comprising on a substrate:
- a first dynamic threshold voltage MOS transistor with a gate, and a channel of a first conductivity type, and
- a current limiter means connected between the gate and the channel of said first MOS transistor.

In accordance with the invention, the first MOS transistor is fitted with a first doped zone of the first conductivity type, connected to the channel, and the current limiter means comprises a second doped zone of a second conductivity type, placed against the first doped zone and electrically connected to the first doped zone by an ohmic connection path.

In terms of the invention, the ohmic connection between the first and second doped zones of a simple connection is distinguished by physical contact resulting from the juxtaposition of these areas.

The ohmic connection may be made, for example, by a layer of electrically conductive material, such as a layer of silicide, which connects the first and second doped zones to each other.

In a particular embodiment of the device of the invention, the current limiter means may be a second MOS transistor. In this case, the second doped zone and a third doped zone of the same conductivity type as the second doped zone may form the source and drain of said transistor.

Between the source and drain of the second transistor, in other words between the second and third doped zones, is a channel area of an opposite conductivity type, that is to the first conductivity type. The doping concentration of the channel is however lower than that of the source and drain.

According to different configurations of polarisation, the gate of the second transistor may be connected to a gate polarisation terminal or to the second doped zone, in other words to the source of the second transistor.

In this second case, a common connection terminal may be provided both for the gate and the second doped zone.

The third doped zone, in other words here the drain of the second transistor, may be connected to the gate of the first transistor.

In another particular embodiment of the invention device, the current limiter means may further be a diode. The second doped zone and a third doped zone, of an opposite conductivity type to that of the second doped zone, then form the terminals of the diode.

While the second and third doped zones have a relatively high doping concentration, they may be separated by a fourth doped zone having a lower doping concentration.

While the second and third doped zones are of an opposite conductivity type, the fourth zone may be either of the conductivity type of the second zone, or of that of the third zone.

The effect of the fourth zone is thus to extend one of the second or third doped zones so as to form a junction of the $P^+N$ or $N^+P$ type.

Just as in the previously described embodiment, the third doped zone may be connected to the gate of the first MOS transistor.

Furthermore, according to a particular embodiment of the diode, the latter may be fitted with a gate extending over the fourth doped zone. This gate does not really have an electrical function but may act, as will emerge in the following description, as an implantation mask of the second and third doped zones, in order to preserve the fourth doped zone.

The diode gate may be left floating or may be connected to one of the diode terminals, in other words to one of the second and third doped zones.

The invention also concerns a process for manufacturing a device such as previously described.

Where the device comprises a current limiter in the form of an MOS transistor, the process comprises the following successive stages:
- a) preparation in a substrate of an active zone, intended to receive the first and second transistors and having a first conductivity type,
- b) formation of a first and a second gate above the active zone, corresponding to the first and second transistors respectively, the gates being separated from the substrate by a gate insulator and covering channel areas of the first and second transistors respectively,
- c) formation of first and second source and drain areas of a second conductivity type opposite to the first conductivity type, corresponding to the first and second transistors respectively, by self-aligned ion implantation on the first and second gates, and formation of the first doped zone of the first conductivity type, in contact with the channel of the first transistor and adjacent to one of the source and drain areas of the second transistor, by self-aligned ion implantation on the gate of the first transistor,
- d) formation of a conductive layer in electrical contact with the first doped zone and one of the source and drain areas of the second transistor adjacent to said first doped zone, so as to connect them electrically.

By self-aligned implantation on a gate is understood an implantation during which the gate is used at least partially as an implantation mask or as a part of an implantation mask.

The process may be completed, after stage d) by deploying an isolator on the substrate, followed by the formation of contact points on the source, drain and gate areas of the transistors.

Furthermore, the process may comprise, additionally, connecting the gate of the first transistor to a doped zone separate from the first doped zone and forming one of the source and drain of the second transistor, and connecting the gate of the second transistor to the first doped zone.

In the example considered in the present description, where the source of the second transistor is constituted by the second doped zone, the gate of the first MOS transistor is connected to the drain of the second transistor, in other words to the third doped zone.

Where the limiter means comprises a diode, the process for manufacturing the device comprises the following successive stages:
- a) preparation in a substrate of a so-called active zone having a first conductivity type, intended to receive the first transistor and the diode,
- b) formation of a first and a second gate above the active zone corresponding to the first transistor and the diode respectively, the gates being separated from the substrate by a gate insulator,
- c) formation of source and drain areas of the first transistor and of said second doped zone, formation of the first doped zone placed between a channel of the first transistor and the second doped zone, and formation of the third doped zone separated from the first doped zone by the second doped zone, the source and drain areas and the first doped zone being formed by self-aligned implantations on the first gate, d) formation of a conductive layer in contact with the first doped zone and the second doped zone so as to connect them electrically.

The different doped areas or zones formed during stage c) may be so formed in any order.

The process may be completed, after stage d), by deploying an isolator on the substrate followed by the formation of contact points on the source and drain areas and on the third doped zone.

It may additionally comprise the interconnection of the third doped zone and of the gate of the first transistor.

The device is preferably made on an SOI type substrate, in other words a substrate having a thin silicon surface layer, insulated by a layer of oxide buried in a silicon block acting as a support.

The components are in this case formed in the thin surface layer. His layer is not generally doped initially. However, the preparation stage a) may comprise a slight doping of the first conductivity type, of all or part of the thin surface layer.

Additionally, the active area may be delimited by local oxidation of the thin surface layer to form field oxide blocks. This surface insulation technique is usually known as "LOCOS" (Localised Oxidation of Silicon). The active area may also be delimited by Shallow Trench Isolation.

The active zone is thus completely insulated by the field oxide blocks and by the buried oxide layer.

Other characteristics and advantages of the present invention will emerge more clearly from the following description, with reference to the appended drawings. This description is given purely by way of illustration and non-restrictively.

DETAILED DESCRIPTION OF MODES FOR IMPLEMENTING THE INVENTION

The following description refers to the manufacture of the device in the silicon surface layer of an SOI type substrate.

Figure 4:
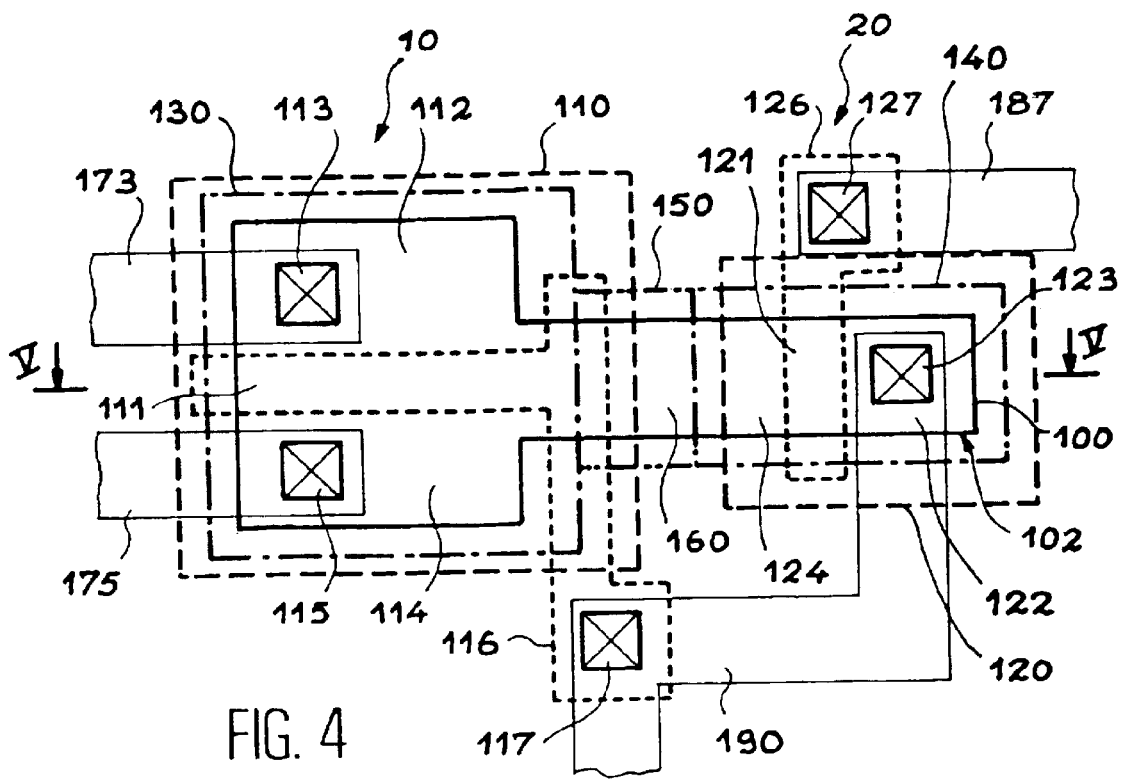
FIG. 4 shows a first implantation diagram for the manufacture of a device according to the invention

The plane of FIG. 4 corresponds to a view from above of the device according to a first embodiment.

A continuous line 100 in FIG. 4 represents the limit of the active zone 102 defined on the surface layer of silicon.

Outside the zone defined by the line 100, the surface layer of silicon is oxidised so as to isolate the active zone laterally.

A certain number of impurity implantation ranges defined above the active zone, and described in more detail hereinafter, partly overlap the oxidised silicon, for implantation pattern design reasons. However, it should be noted that the implanted doping impurities reaching the silicon oxide which surrounds the active zone, are ineffective and do not modify the isolating electrical character of the oxide.

At least one first P-type implantation is practised in two implantation ranges 110, 120, which correspond in particular to the channels of a first and a second transistor 10 and 20 which it is desired to form. These ranges are shown by a regular broken line in the figure and are defined, for example, by an aperture in an implantation mask not shown.

As shown previously, these transistors correspond to the DTMOS transistor and to the current limiter transistor in terms of the invention.

The first implantation is P type in so far as the transistor 10 and 20 which it is desired to make are NMOS transistors. The device may however be also made with PMOS transistors. In this case, the first implantation is N type.

The first implantation is followed by the formation of a layer of insulator, for example of oxide, then by a layer of gate material, for example of polycrystalline silicon.

The layers are etched according to a pattern allowing the form and location of gates 116 and 126 of the first and second transistor respectively to be fixed.

It may be seen that the gate 116 of the first transistor has a T shape at least one branch of which extends beyond the active zone.

The definition of the gates may be followed by the formation of lateral spacers on their sides. These spacers are not shown in FIG. 4 for reasons of clarity.

After the formation of the gates at least one $N^+$ type implantation is effected with a concentration above that of the first implantation. In the remainder of the text the symbols $N^+$ and $P^+$ are used to denote implantations or implanted areas of N and P conductivity type with a heavy concentration of doping impurities.

It should be specified that the second implantation may also be $P^+$ type when the transistors formed a re PMOS transistors.

The second implantation takes place in implantation ranges 130, 140 extending on either side of at least one part of each gate 116, 126. The implantation ranges 130, 140 are shown in a dot and dash line and are defined, for example, by apertures in an implantation mask not shown.

During the second implantation are formed, in the active zone, the drain 112 and the source 114 of the first transistor and also the drain 122 and the source 124 of the second transistor.

The source 124 and the drain 122 correspond respectively to the second and third doped zones mentioned in the first part of the description.

The $N^+$ type zones 112, 114, 122 and 124 do not extend, or only very slightly, under the gates.

Indeed, the gates act, during implantation, as an implantation mask, with the result that the $N^+$ type zones are self-aligned on the gates.

Under the gate 116 of the first transistor 10 there is consequently a P type zone resulting from the first implantation. A part of this zone located between the source and drain 112, 114 constitutes the channel 111 of the first transistor 10.

In the same way, the P type channel 121 of the second transistor 20 is located under the second gate 126 and between the source and drain 124 and 122 of the second transistor.

A third $P^+$ type implantation (or, as an alternative $N^+$ for PMOS transistors) is effected in a range 150 defined, for example, by an implantation mask not shown.

It may be seen that the implantation range 150 shown in a dual dot and dash line overlaps a part of the gate 116 of the first transistor and coincides with a part of the P type active zone and extends to the source 124 of the second transistor.

A part of the gate 116 of the first transistor may thus be used as an implantation mask, so that the doped zone 160 formed during the third implantation is self-aligned on this gate.

The doped $P^+$ type zone 160 corresponds to the first doped zone previously mentioned and is so designated in the remainder of the text. It constitutes a substrate point for the first transistor 10.

A self-aligned silicidation on the gates is thus practised. It allows a layer of silicide to be formed on the active zone and on the gates. The essential function of this layer of silicide is to form an electrical connection by ohmic contact between the first doped zone 160 and the source 124 of the second transistor.

The layer of silicide, for example of $TiSi_2$, or $CoSi_2$, not shown in FIG. 4, may be formed by depositing a layer of titanium or of cobalt, followed by heat treatment.

After silicidation, the deposit and planarisation of electrical insulator material is carried out allowing the device to be protected. The electrical insulator material is for example a silicon oxide.

The electrical insulator material is then etched locally, according to a pre-set pattern, to form access passages to the components and to make contact points on them.

Lastly, after filling the passages with a conductive material, such as metal, there are formed, on the surface of the electrical insulator material, conductive interconnection tracks connected to the contact points.

In FIG. 4, the references 113, 115, 123, 117, 127 denote contact points connected to the drain and to the source of the first transistor, to the drain of the second transistor, and to the gates of the first and second transistors respectively.

The references 173, 175, 187 denote metal interconnection tracks, for example of Al, Ti or W, connected to the contact points 113, 115 and 127, to connect them possibly to other components not shown.

The reference 190 denotes an interconnection track which connects the contact point 117 of the gate of the first transistor to the contact point 123 of the drain 122 of the second transistor.

It may also be seen in FIG. 4 that the contact points 117, 127 on the gates are made outside the active zone 102, in other words above the silicon oxide which surrounds the active zone.

Figure 5:
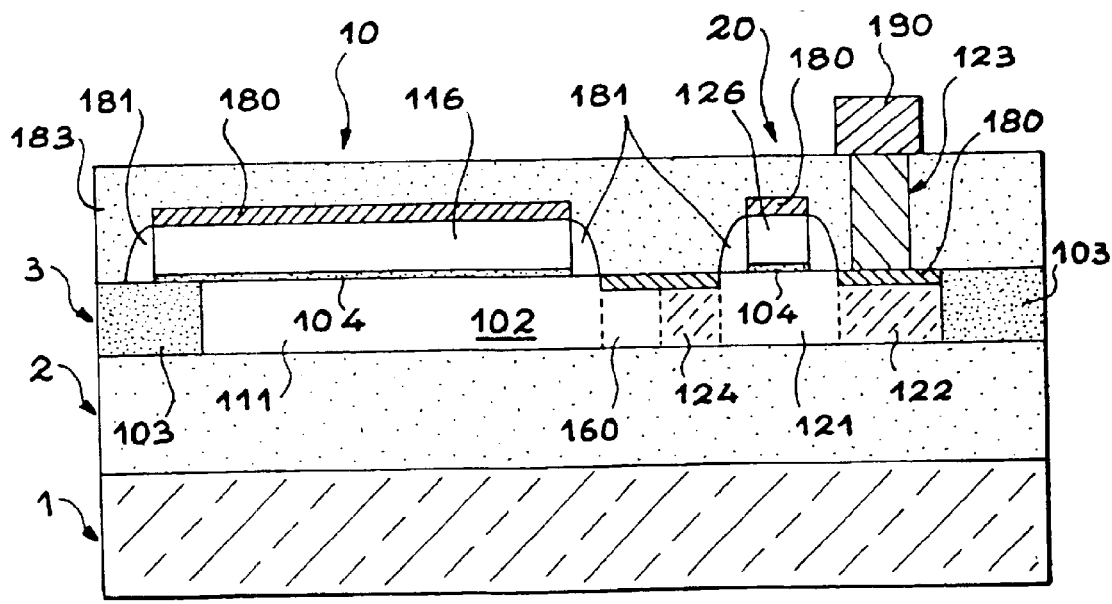
FIG. 5 is a diagrammatic cross-section of a device according to the invention along a plane V—V shown in FIG. 4.

FIG. 5 is a diagrammatic cross-section of the device obtained according to the diagram in FIG. 4 and along the plane V—V shown in FIG. 4.

The device is made in an SOI type substrate including a solid part 1 of silicon, a buried layer 2 of silicon oxide and a thin surface layer 3 of silicon. For reasons of convenience, the scales of thickness of the different layers and parts of the device are not respected.

In the surface layer of silicon, an active zone 102 is delimited by blocks of silicon oxide 103 which extend to the buried oxide layer. The active zone is therefore insulated relative to the solid part 1 of the substrate and possibly other active zones not shown, defined in the same surface layer.

In the active zone, there may be distinguished, in order, from left to right in the figure, the P type channel 111 of the first transistor 10, the first $P^+$ type doped zone 160 in contact with the channel 111, the source 124 of the second $N^+$ type transistor 11, in contact with the first doped zone, the P type channel 121 of the second transistor 11, then the $N^+$ type drain 122 of the second-transistor 11.

Above the channel 111 of the first transistor and above the channel 121 of the second transistor may be distinguished the gates 116 and 126 of the first and second transistors respectively. The gates, for example of polycrystalline silicon, are separated from the surface layer of silicon 3 by a very thin layer of silicon oxide 4.

On the parts of the active zone not covered by the gates, in the same way as on the gates, the presence may be noted of a layer of titanium or cobalt silicide 180. The layer of silicide establishes in particular an ohmic electrical contact between the first doped area 160 and the source 124 of the second transistor.

Before silicidation, lateral insulating spacers 181 are formed on the lateral sides of the gates, by deposit of a layer of silicon oxide or nitride then by anisotropic etching of this layer.

The essential function of the lateral spacers 181 is to prevent a short-circuit between the gates, the source areas, and the drain areas, during formation of the layer of silicide 180.

Possibly, the lateral spacers may be formed before implantation of the source and drain areas of the transistors, and also act, just like the gates, as an implantation mask for these areas.

An insulation layer 183 is formed by deposit then by planarisation of a material such as silicon oxide. The layer 183, the surface of which is plane coats the gates and covers the silicide layer 180.

FIG. 5 also shows the contact point 123 which is presented in the form of a well passing through the insulation layer 183 to reach the layer of silicide above the drain 122 of the second transistor. The well is filled with an electrical conductive material such as W or Ti which allows the drain to be electrically connected to the interconnection track 190.

FIGS. 4 and 5 described above correspond to the manufacture of a dynamic threshold voltage NMOS transistor.

A PMOS transistor of this type may also be made by replacing the N+, P, P+ type areas by P+, N and N+ areas respectively.

Figure 2:
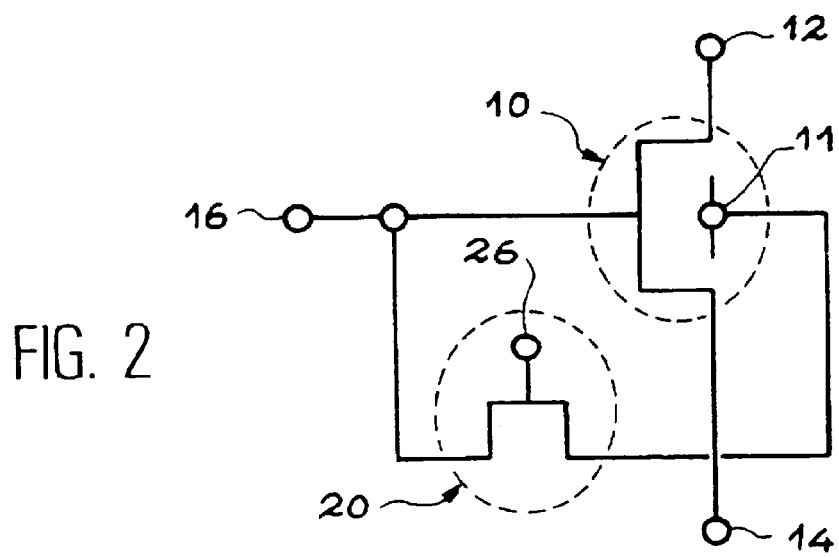
FIG. 2, already described, is an electrical diagram of the transistor in FIG. 1, fitted with a current limiter, according to a first polarisation configuration of the limiter.

Furthermore, it may be seen that making the transistor according to FIGS. 4 and 5 corresponds to the electrical diagram in FIG. 2 previously described.

Figure 3:
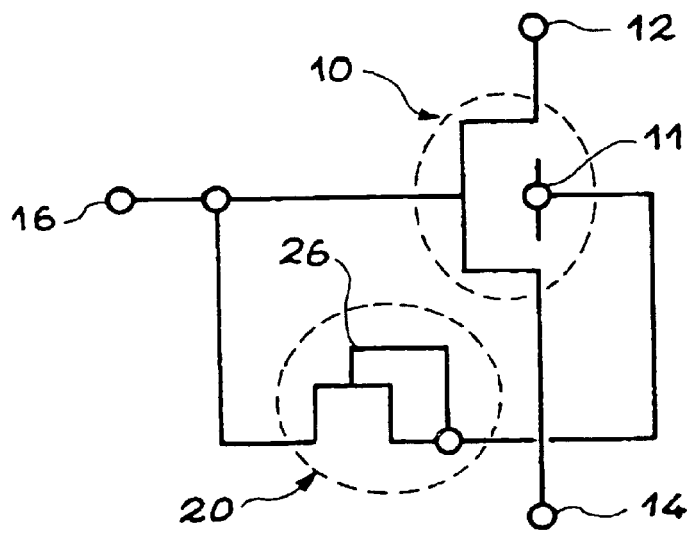
FIG. 3, already described, is an electrical diagram of the transistor in FIG. 1, fitted with a current limiter, according to a second polarisation configuration of the limiter.
Figure 6:
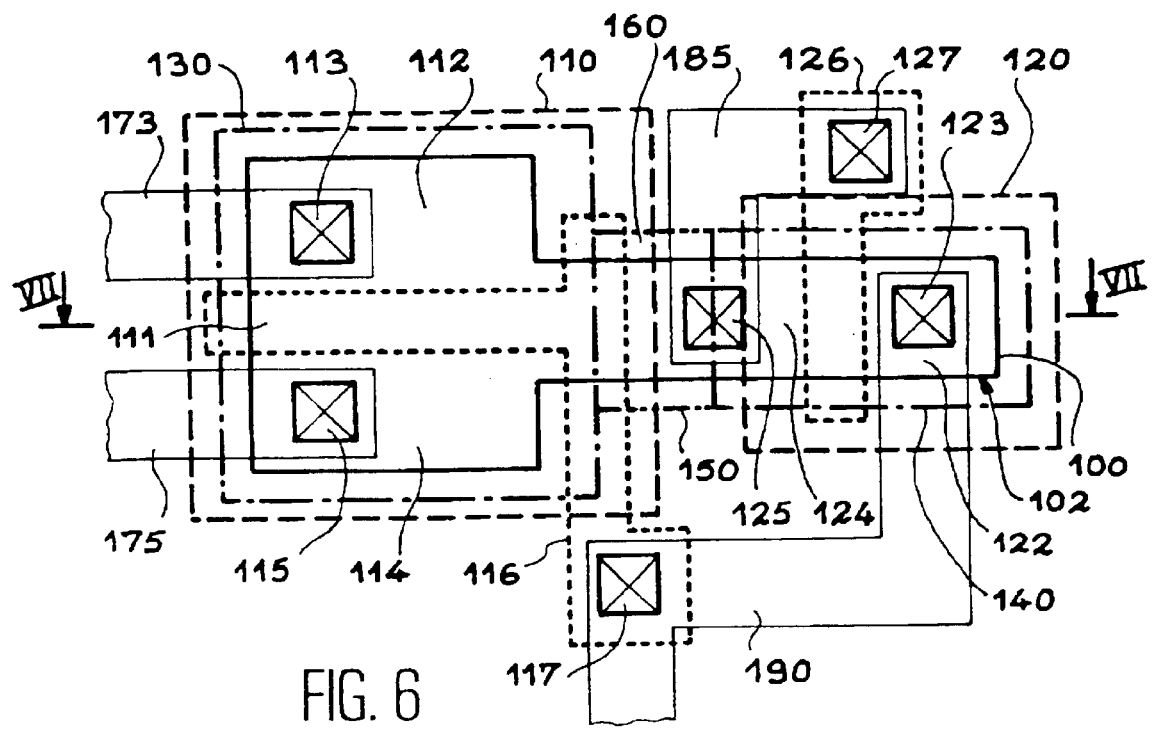
FIG. 6 shows a second implantation diagram for the manufacture of a device according to the invention.

FIG. 6 is a view from above of an implantation diagram for making a DTMOS transistor according to a variant corresponding to the electrical diagram in FIG. 3.

A large number of elements in FIG. 6 are identical to corresponding elements in FIG. 5. These elements carry the same references and a detailed description of them is not given here. Reference may be made to the preceding description.

It may be seen that a contact point 125 is formed in an area overlapping the first doped zone 160 and the source zone 124 of the second transistor. It is connected furthermore to the contact point 127 of the gate of the second transistor by an interconnection track 185.

It should however be noted in this respect that the contact point 125 constitutes essentially a contact point for the substrate or, more exactly, for the channel of the first transistor.

Figure 7:
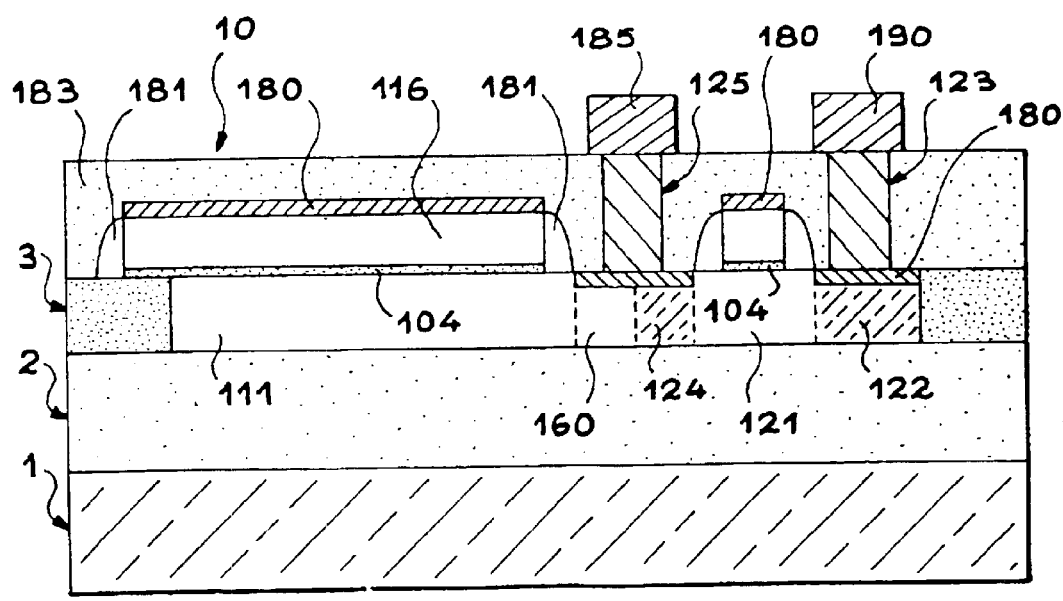
FIG. 7 is a diagrammatic cross-section of a device according to the invention along a plane VII—VII shown in FIG. 6.

The contact point 125 and the interconnection track 185 can also be seen in FIG. 7 which is a cross-section of a device manufactured in accordance with the implantation diagram in FIG. 6, seen along the plane VII—VII shown in this figure.

The contact point 125 overlaps to an approximately equal extent the first doped zone 160 and the source area 124. The position of the contact point is not critical however. Indeed, since a conductive link exists between the zones mentioned above, by virtue of the layer of silicide 180, it is sufficient for the contact point 125 to come into contact with the silicide layer portion 180 which coats these zones.

Figure 8:
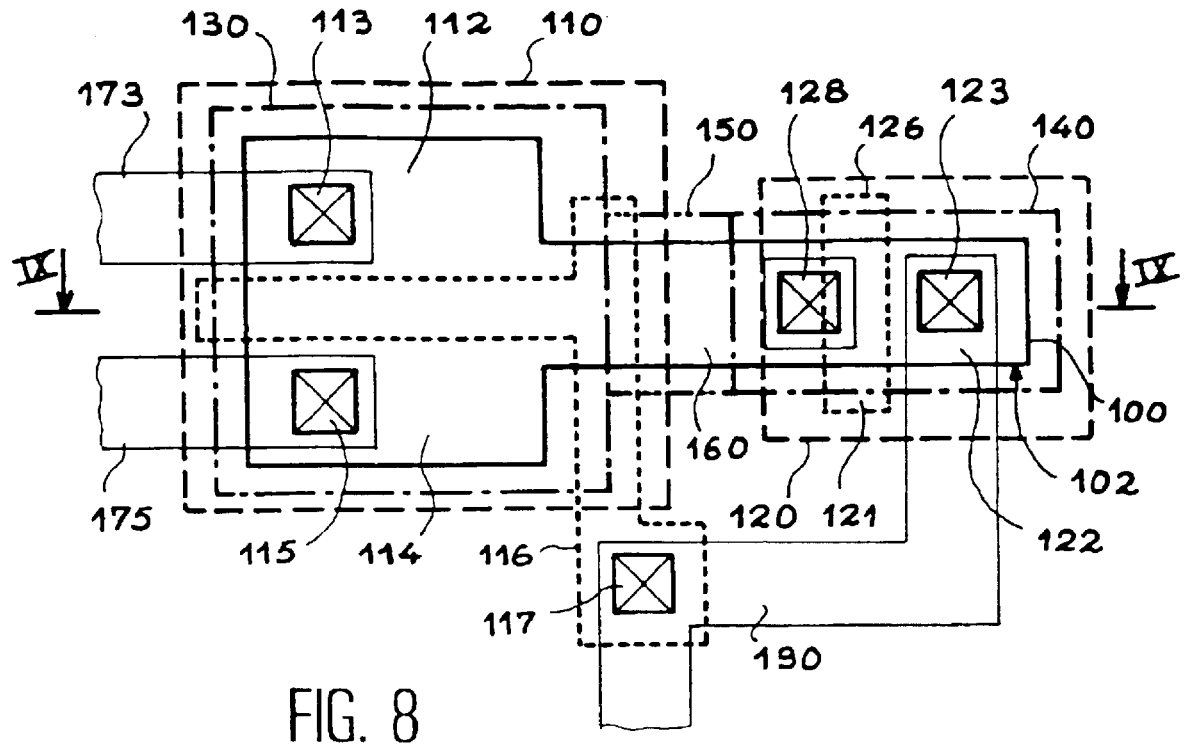
FIG. 8 shows a third implantation diagram for the manufacture of a device according to the invention.

A device variant corresponding to the same electrical diagram may also be made along the implantation plane in FIG. 8.

This plane is distinguished from that in FIG. 6 in that a single contact point 128 replaces the contact point of the gate of the second transistor, the contact point connected to the source and to the first doped zone, as well as the interconnection track connecting them.

Figure 9:
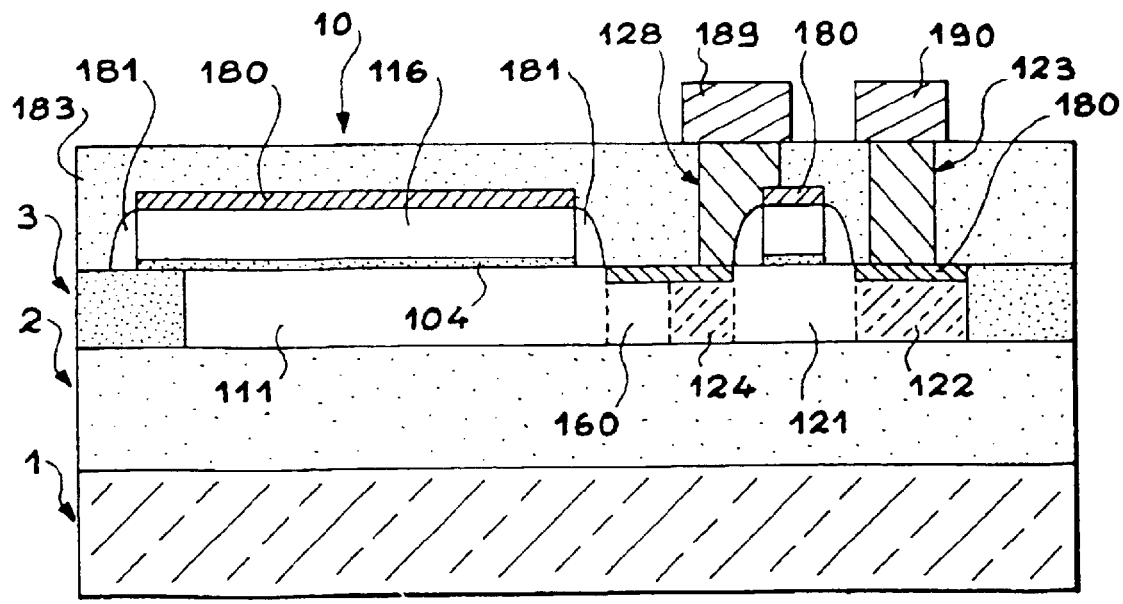
FIG. 9 is a diagrammatic cross-section of a device according to the invention along a plane IX—IX shown in FIG. 8.

As is shown in cross-section in FIG. 9, the contact point 128 partly overlaps the gate 126 and the source 124 of the second transistor.

The conductive material of the contact point 128 connects electrically the gate 126 and more exactly the silicide layer portion which coats the gate, to the silicide layer portion which coats the source zone 124 and the first doped zone 160. The contact point 128 may possibly be capped with a metal terminal 189.

Comparing this structure with that in FIGS. 6 and 7, it may be noted that the contact point 127 may be omitted, as may be the interconnection track 185.

The device in FIGS. 8 and 9 may therefore be made more compactly than the devices previously described.

Figure 10:
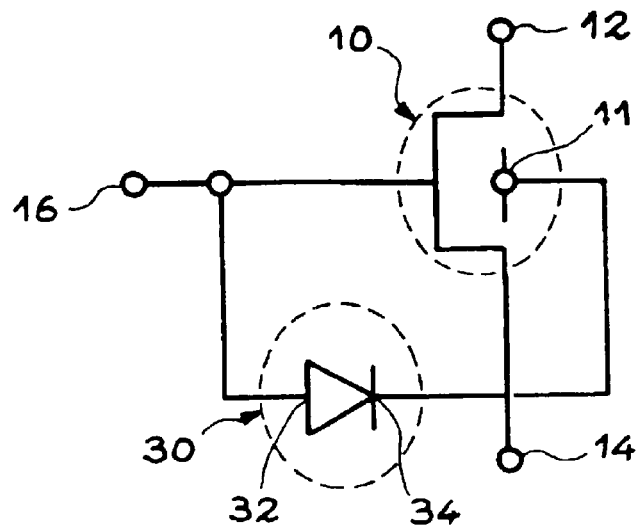
FIGS. 10 and 11 are electrical diagrams corresponding to another embodiment possibility of the device of the invention.

FIG. 10 is an electrical diagram corresponding to a second possible design of the device of the invention wherein the second transistor is replaced by a diode 30.

Figure 1:
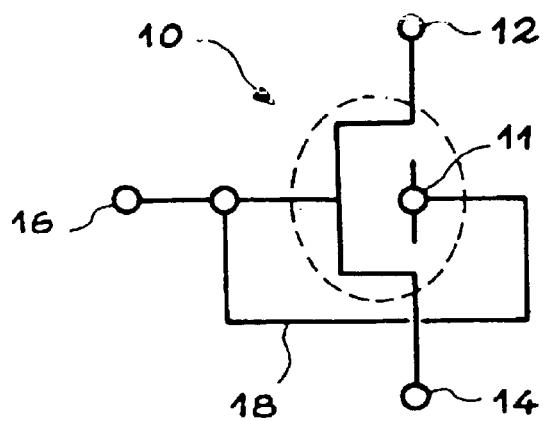
FIG. 1, already described, is an electrical diagram corresponding to a dynamic threshold voltage MOS transistor (DTMOS).

The anode 32 of the diode 30 is connected to the gate 16 of the first transistor 10 and the cathode 34 of the diode is connected to the substrate of the transistor 10, more exactly to its channel. The drain and source terminals of the transistor 10 are still identified by the references 12 and 14. A terminal of the substrate, or more exactly of the transistor channel, carries the reference 11 by analogy with FIGS. 1 to 3.

The diagram in FIG. 10 corresponds to that of a device constructed around an NMOS type transistor.

Figure 11:
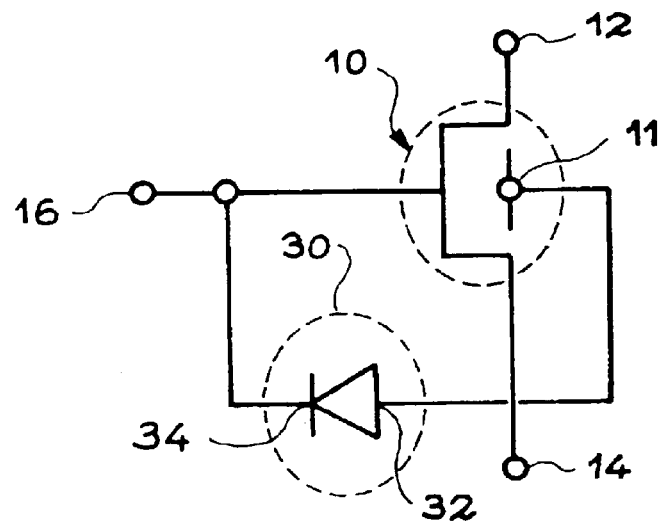

FIG. 11 gives for information only the electrical diagram intended for a PMOS transistor. It may be seen that, in this case, the cathode 34 of the diode is connected to the gate of the transistor and the anode 32 to the substrate (channel).

The diode 30, the essential function of which is to limit the current passing through the substrate point of the transistor, is connected in series with the "diodes" corresponding to the substrate-source and substrate-drain junctions of the transistor.

Figure 12:
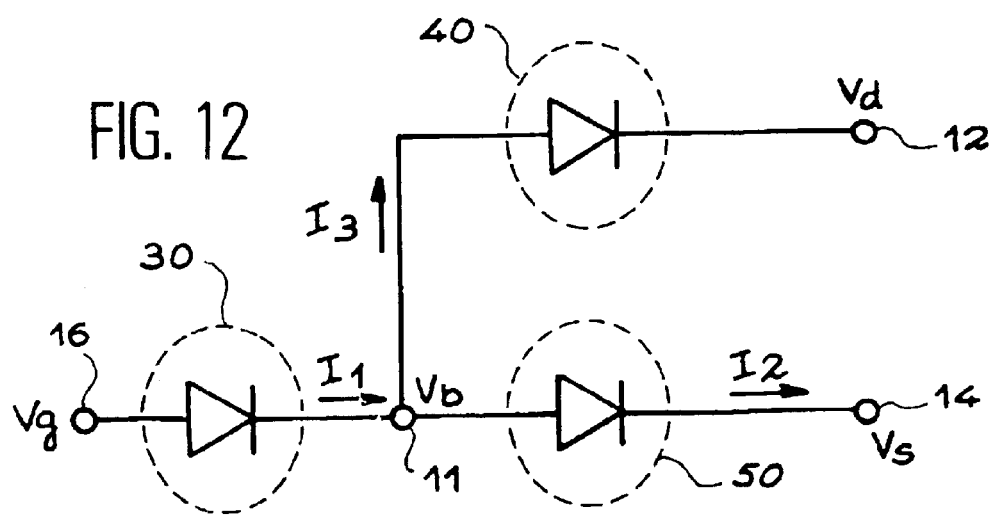
FIG. 12 is an electrical diagram equivalent to that in FIG. 10.

For the device in FIG. 10, using an NMOS transistor, an equivalent electrical diagram is given in FIG. 12.

In this figure, the references 40 and 50 denote the substrate-drain "diode" and the substrate-source "diode" of the transistor respectively. The references 11, 12, 14 and 16 denote substrate, drain, source and gate terminals of the transistor respectively. The letters $V_b$, $V_d$, $V_s$ and $V_g$ carried in the figure in the vicinity of the terminals of the electrical diagram are used in the remainder of the text to denote the substrate, drain, source and gate voltages.

$V_t$ further denotes the threshold voltage of the transistor. It may also be expressed by the following formula:

$$V_t = V_{fb} + 2\phi_f + \gamma\sqrt{2\phi_f - V_{bs}} \qquad (1)$$

where $V_{bs}=V_b-V_s$ and where $V_{fb}$ is the flat band voltage.

To determine the threshold voltage of the DTMOS, when the current limiter means is a diode, the substrate potential $V_b$ in the proposed structure should be calculated and its expression conveyed in the equation (1). The current equation of a diode (or junction) passed through by a current I at a low rate of injection is:

$$I = I_0\left[\exp\left(\frac{V}{nU_t}\right) - 1\right]$$

In this expression, V is the voltage applied to the terminals of the diode, n its ideality factor, Ut=kT/q is the thermal potential, q the electron charge, k the Boltzmann constant, T the temperature, $I_0$ the dark current.

The current equation of the diode 30 acting as limiter is thus:

$$I_1 = I_{01}\left[\exp\left(\frac{V_g - V_b}{nU_t}\right) - 1\right]$$

The current equation of the substrate-source "diode" 50 is:

$$I_2 = I_{02}\left[\exp\left(\frac{V_b - V_s}{nU_t}\right) - 1\right]$$

and the current equation of the substrate-drain "diode" 40 is:

$$I_3 = I_{02}\left[\exp\left(\frac{V_b - V_d}{nU_t}\right) - 1\right]$$

$I_{01}$, $I_{02}$ are respectively the dark currents of the diodes mentioned above.

The dark current of the diode acting as limiter is presumed different from that of the substrate-source and substrate-drain junctions. With reference to FIG. 11, it may be seen that the current passing through the clamping diode is equal to the sum of the currents passing through the substrate-drain and substrate-source diodes i.e.:

$$I_1 = I_2 + I_3$$

The solution of this equation allows the substrate potential to be expressed as a function of the gate potential:

$$v_{bs} = nU_t \ln\left[\frac{2I_{02} - I_{01} + \sqrt{(I_{01} - 2I_{02})^2 + 4I_{01}I_{02}\exp\left(\frac{V_{gs}}{nU_t}\right)}\left(1 + \exp\left(-\frac{V_{ds}}{nU_t}\right)\right)}{2I_{02}\left(1 + \exp\left(-\frac{V_{ds}}{nU_t}\right)\right)}\right]$$

in this expression it may be noted that:

$$V_{gs} = V_g - V_s \text{ and } V_{ds} = V_d - V_s.$$

The expression of $V_{bs}$ obtained conveyed in the equation (1) allows the variation in threshold voltage of the DTMOS transistor with the current clamping diode to be calculated as a function of the voltage applied to its gate.

By way of example, if the clamping diode is dimensioned in such a way as to give:

$$I_{01} = 2I_{02}$$

the substrate potential becomes:

$$V_{bs} = \frac{V_{gs}}{2} - \frac{nU_t}{2}\ln\left[1 + \exp\left(-\frac{V_{ds}}{nU_t}\right)\right]$$

When the difference in potential $V_{ds}$ exceeds a few times $U_t$ (during normal operation of the transistor), the simple relation is obtained:

$$V_{bs} \approx \frac{V_{gs}}{2}$$

The DTMOS threshold voltage with current limiting by diode may therefore be approximated by:

$$V_t = V_{fb} + 2\phi_f + \gamma\sqrt{2\phi_f - \frac{V_{gs}}{2}}$$

Figure 13:
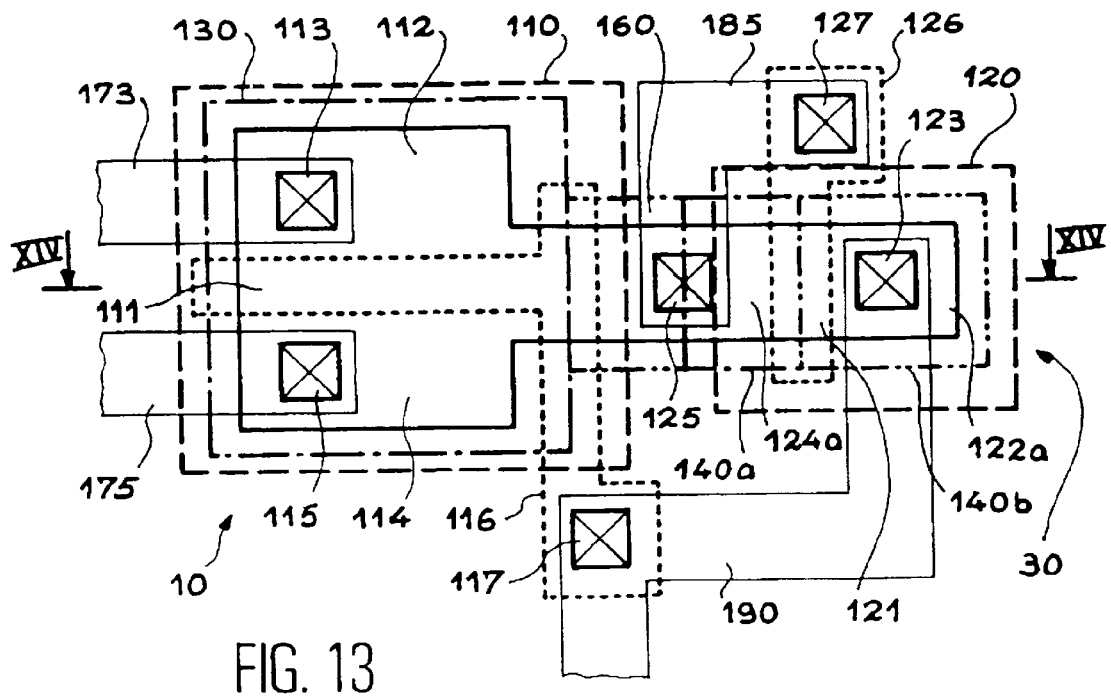
FIG. 13 is a fourth implantation diagram for the manufacture of a device according to the invention, according to the electrical diagram in FIG. 10.

FIG. 13 shows an implantation diagram for the manufacture of a device corresponding to the electrical diagrams in FIGS. 10 and 12.

By virtue of a great number of similarities with FIGS. 4, 6 and 8, identical or equivalent elements are identified with the same references so that reference may be made to the preceding description.

The process for manufacturing the transistor 10 and the diode 30 is approximately the same as the process of manufacturing the first transistor 10 and the second transistor 11 in FIG. 4.

Indeed, although in the case of the present embodiment, the current limiting means are a diode, the gate 126 is retained.

This gate allows a second N$^+$ type doped zone 124a to be separated from a third P$^+$ type doped zone 122a.

It may be seen that the second and third doped zones correspond, by their location, to the source and drain zones of the transistor 20 which can be seen in FIGS. 4, 6 and 8.

The second and third N$^+$ and P$^+$ type doped zones are implanted respectively in implantation ranges 140a, 140b defined by implantation masks not shown.

Same conductivity type zones may be made concomitantly.

Thus, the second doped zone 124a may be implanted simultaneously with the source and drain zones 112, 114 of the transistor 10 whereas the third doped zone 122a may be implanted simultaneously with the first doped zone 160.

It may be seen that the implantation ranges 140a and 140b partly overlap the second gate 126 which also acts as an implantation mask. The second and third doped zones are thus self-aligned on the second gate 126.

Under the gate 126 is a fourth P (or N) type doped zone 121 which connects the second and third doped zones.

The fourth doped zone is P (or N) type by virtue of the initial preparation of the substrate. It is protected by the gate 126 during implantations of the second and third doped zones.

The fourth P (or N) type doped zone extends the third doped zone 122a, also of P$^+$ type, but the doping concentration of which is higher than that of the fourth zone.

Thus the current clamping diode 30 is formed by the N+/P junction between the second doped zone (or P+/N) 124a and the third doped zone 122a extended by the fourth doped zone 121.

The second and third doped zones form the terminals of the diode.

Although the gate 126 above the fourth doped zone can be left at a floating potential, FIG. 13 shows an interconnection line 185 which connects a connection point 127 in contact with the gate 126 and a connection point 125 in contact with the first and second doped zones respectively.

Figure 14:
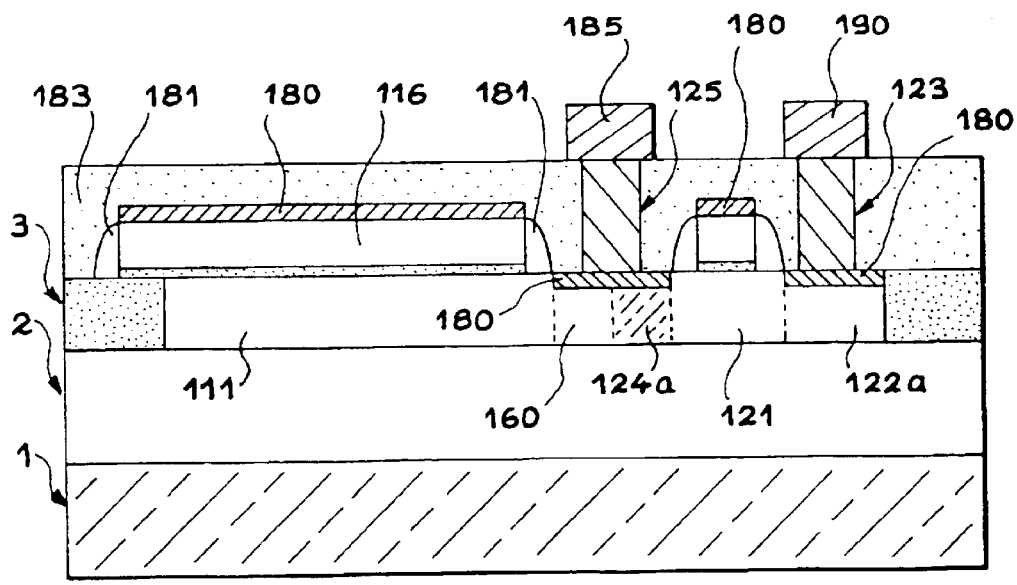
FIG. 14 is a diagrammatic cross-section of a device according to the invention along a plane XIV—XIV shown in FIG. 13.

FIG. 14 is a transverse cross-section of the device corresponding to FIG. 13, along a cross-section plane XIV—XIV also shown in FIG. 13. Identical or similar parts to those in FIGS. 5, 7, 9 and 14 are identified with the same references. Reference may be made in this respect to the preceding description.

FIG. 14 shows that the first and second doped zones are coated by a silicide layer portion 180 with the result that they are at the same electrical potential. The silicide layer in fact provides an electrical ohmic contact between these zones. Thus, the connection point 125 in contact with the first and second doped zones, which is shown in a position overlapping these zones, and which is in contact with the portion of the silicide layer which coats said zones, could be offset above one only of the first and second doped zones.

FIG. 14 also highlights a particular role of the second gate 126 and of its lateral spacers. This role is to isolate the silicide layer portion 180 which coats the first and second doped zones 160, 124a of the portion of this layer which coats the third doped zone 122a.

The references 123 and 190 show a contact point on the third doped zone 122a and an interconnection track, which can also be seen in FIG. 13, which connects this zone to the transistor gate.

Figure 15:
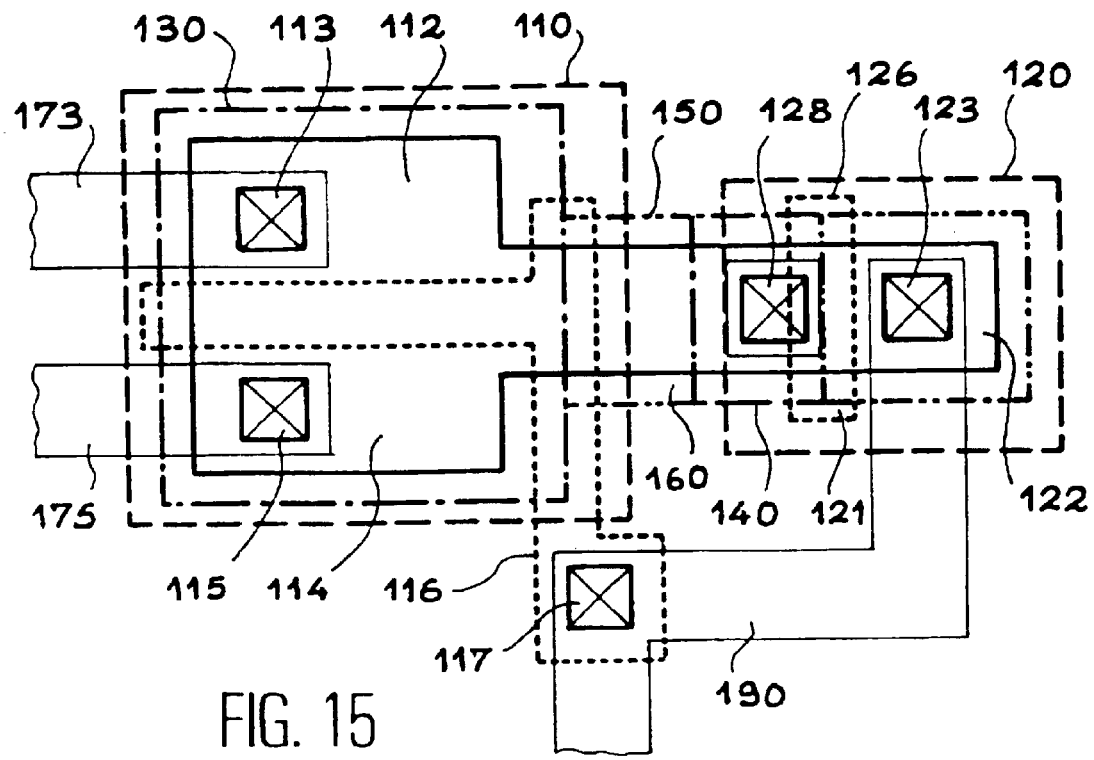
FIG. 15 is a fifth implantation diagram for the manufacture of a device according to the invention, according to the electrical diagram in FIG. 10.

The device described above may also be made along an implantation plane in accordance with FIG. 15.

FIG. 15 is distinguished from FIG. 13 in that a contact point 128 intended for the first and second doped zones is positioned so as to overlap the second doped zone and the gate 126 of the diode.

Thus, the conductive material of the contact point electrically connects the gate to the first and second doped zones.

Such an arrangement, comparable to that in FIG. 8, allows the corresponding interconnection 185 which can be seen in FIG. 13 to be omitted, and thus the device to be made more compact.

Figure 16:
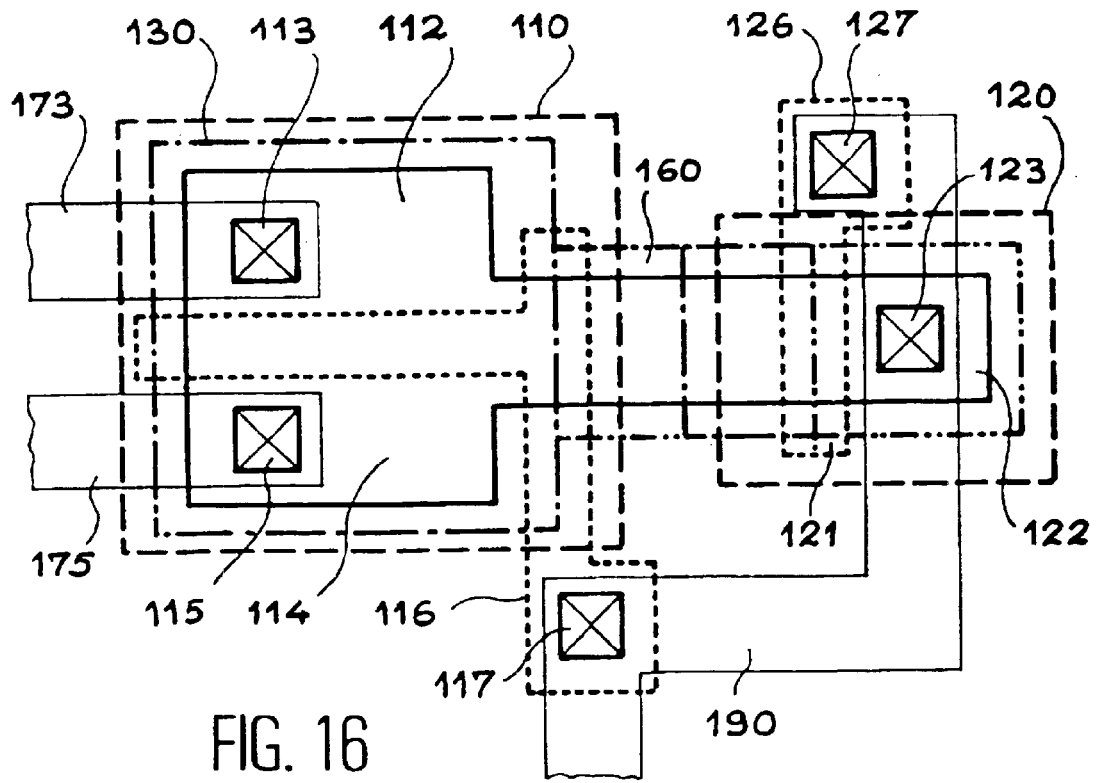
FIG. 16 is a sixth implantation diagram for the manufacture of a device, according to the invention according to the electrical diagram in FIG. 10.

Another embodiment variant of the device is illustrated by FIG. 16.

In this figure it may be seen that the contact point 127 of the gate is connected to the contact point 123 of the third doped zone by an extension of the interconnection track 190.

Figure 17:
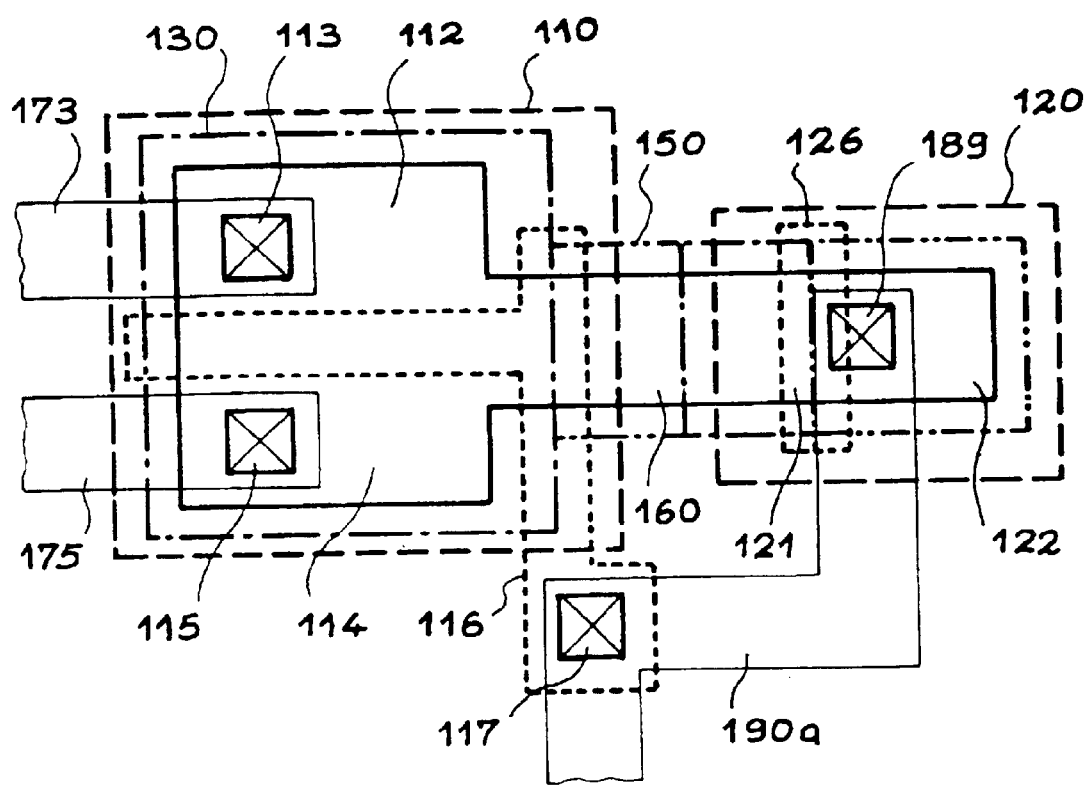
FIG. 17 is a seventh implantation diagram for the manufacture of a device according to the invention, according to the electrical diagram in FIG. 10.

Lastly, a final embodiment variant of the device, illustrated by FIG. 17 and approximately equivalent to the previous one, makes it possible to save on one specific contact point for the gate and the extension of the interconnection track 190.

Indeed, a contact point 189, common to the gate 126 and to the third doped zone 122a, is arranged so as to overlap these two parts and connect them electrically.

The contact point 189 is furthermore connected to the contact point 117 of the gate of the transistor by means of an interconnection 190a.

DOCUMENTS CITED (1) J. P. Colinge, "An SOI Voltage-Controlled Bipolar-MOS Device", IEEE Transactions on Electron devices, volume ED-34, no. 4, p. 845, 1987.
(2) M. Matloubian, "Analysis of Hybrid-Mode Operation of SOI MOSFET's", IEEE International SOI Conference Proceedings, p. 106, 1993.
(3) F. Assaderaghi et al., "A Dynamic Threshold Voltage MOSFET (DTMOS) for Ultra-Low Voltage Operation", International Electron Devices Meeting Technical Digest, p. 809, 1994.
(4) Y. P. Tsividis, "Operation and Modeling of the MOS Transistor", MacGraw-Hill Book Company, 1987.

What is claimed is:

1. A semiconductor device formed on a substrate, comprising:

a first dynamic threshold voltage MOS transistor having a gate and a channel of a first conductivity type;

a first doped zone of the first conductivity type coupled to the channel of said first MOS transistor; and a transistor or diode type current limiter coupled between the gate of said first MOS transistor and said first doped zone, said current limiter comprising a second doped zone of a second conductivity type physically disposed against and in ohmic connection with said first doped zone.

2. The device according to claim 1, wherein the transistor or diode type current limiter comprises a second transistor, the second doped zone embodying the source of said second transistor.

3. The device according to claim 2, wherein the second transistor includes a gate coupled to a gate polarization terminal.

4. The device according to claim 2, wherein the second transistor has a gate coupled to said second doped zone.

5. The device according to claim 4, further comprising a terminal that is coupled to the gate of said second transistor and to the second doped zone.

6. The device according to claim 4, wherein a drain of said second transistor is coupled to the gate of the first MOS transistor.

7. The device according to claim 1, wherein the transistor or diode type current limiter comprises a diode, the second doped zone embodying a first terminal of the diode and a third doped zone of a conductivity type opposite that of the conductivity type of the second doped zone embodying a second terminal of the diode.

8. The device according to claim 7, further comprising a fourth doped zone disposed between the second and third doped zones, said fourth doped zone having the same conductivity type as the conductivity type of either the second or third zones.

9. The device according to claim 7, wherein the third doped zone is coupled to the gate of the first MOS transistor.

10. The device according to claim 8, wherein the diode comprises a gate extending over the fourth doped zone.

11. The device according to claim 10, wherein said diode gate is coupled to one of the diode terminals.

* * * * *

UNITED STATES PATENT AND TRADEMARK OFFICE
CERTIFICATE OF CORRECTION

PATENT NO. : 6,787,850 B1
DATED : September 7, 2004
INVENTOR(S) : Pelloie

It is certified that error appears in the above-identified patent and that said Letters Patent is hereby corrected as shown below:

Column 6,
Line 66, after "the transistors formed", replace "a re" with -- are --.

Signed and Sealed this

Thirtieth Day of August, 2005

JON W. DUDAS
*Director of the United States Patent and Trademark Office*